(12) United States Patent
Shimoda et al.

(10) Patent No.: US 6,541,354 B1
(45) Date of Patent: Apr. 1, 2003

(54) METHOD FOR FORMING SILICON FILM

(75) Inventors: Tatsuya Shimoda, Nagano-ken (JP); Satoru Miyashita, Suwa (JP); Shunichi Seki, Suwa (JP); Masahiro Furusawa, Suwa (JP); Ichio Yudasaka, Chino (JP); Yasumasa Takeuchi, Yokohama (JP); Yasuo Matsuki, Yokkaichi (JP)

(73) Assignees: Seiko Epson Corporation, Tokyo (JP); JSR Corporation, Tokyo (JP)

( * ) Notice: Subject to any disclaimer, the term of this patent is extended or adjusted under 35 U.S.C. 154(b) by 0 days.

(21) Appl. No.: 09/701,647

(22) PCT Filed: Mar. 29, 2000

(86) PCT No.: PCT/JP00/01988

§ 371 (c)(1),
(2), (4) Date: Nov. 30, 2000

(87) PCT Pub. No.: WO00/59015

PCT Pub. Date: Oct. 5, 2000

(30) Foreign Application Priority Data

Mar. 30, 1999 (JP) ......................................... 11-090312 P

(51) Int. Cl.[7] ........................... H01L 21/20; H01L 21/36
(52) U.S. Cl. ....................... 438/478; 438/482; 438/486; 438/488; 438/497; 438/502
(58) Field of Search .................. 438/478, 482, 438/486, 488, 497, 502, 503, 507, 509

(56) References Cited

U.S. PATENT DOCUMENTS

| | | | | | |
|---|---|---|---|---|---|
| 3,490,961 A | * | 1/1970 | Frieser et al. | ................ | 117/102 |
| 4,683,146 A | * | 7/1987 | Hirai et al. | .................. | 427/583 |
| 5,866,471 A | * | 2/1999 | Beppu et al. | ................ | 438/502 |
| 6,099,911 A | * | 8/2000 | Yano et al. | ............... | 427/397.7 |
| 6,274,648 B1 | * | 8/2001 | Meguriya et al. | ........... | 523/218 |

FOREIGN PATENT DOCUMENTS

| JP | 5-144741 | 6/1993 |
|---|---|---|
| JP | 6-191821 | 7/1994 |
| JP | 8-8179 | 1/1996 |
| JP | 10-321536 | 12/1998 |
| JP | 2000-7317 | 1/2000 |
| JP | 2000-12465 | 1/2000 |
| JP | 2000-31066 | 1/2000 |

* cited by examiner

*Primary Examiner*—Amir Zarabian
*Assistant Examiner*—Maria Guerrero
(74) *Attorney, Agent, or Firm*—Oliff & Berridge, PLC.

(57) ABSTRACT

A solution containing a cyclic silane compound, which does not contain carbon, and/or a silane compound modified by boron or phosphorus is applied onto a substrate and a silicon precursor film is formed, and the film is then transformed into semiconductor silicon by heat and/or light treatment. Thereby, it is possible to easily produce a silicon film having satisfactory characteristics as an electronic material at low costs, differing from the vacuum process, such as by CVD methods.

21 Claims, No Drawings

METHOD FOR FORMING SILICON FILM

BACKGROUND OF THE INVENTION

1. Field of the Invention

The present invention relates to methods of forming silicon films used for LSIs, thin-film transistors, and photosensitive members.

2. Description of Related Art

Conventionally, as methods for forming amorphous silicon films and polysilicon films, thermal CVD (Chemical Vapor Deposition), plasma-enhanced CVD, photo CVD, etc., using monosilane gas or disilane gas, are employed. In general, thermal CVD is widely used for polysilicon (refer to J. Vac. Sci. Technology., Vol. 14, p. 1082 (1977)), and plasma-enhanced CVD is widely used for amorphous silicon (refer to Solid State Com., Vol. 17, p. 1193 (1975)). The above methods are used in the fabrication of liquid crystal display devices provided with thin-film transistors, solar cells, etc.

SUMMARY OF THE INVENTION

However, in the formation of silicon films by CVD methods described above, further improvement in the process has been awaited for the reasons described below. 1) Since silicon particles are generated in a vapor phase due to the use of the vapor phase reaction, yield is decreased due to the contamination of apparatuses and the generation of extraneous matter; 2) since the raw material is gaseous, it is difficult to produce a film of uniform thickness on a substrate having an uneven surface; 3) since the film forms slowly, productivity is low; and 4) in plasma-enhanced CVD, complex and expensive high-frequency generators, vacuum systems, etc., are required.

Additionally, since a gaseous silicon hydride, which is highly toxic and reactive, is used, handling is difficult, and a closed vacuum system is required because of the gaseous nature of the material. In general, such apparatuses are large, and the apparatuses themselves are expensive, and also a large amount of energy is consumed by the vacuum system and the plasma system, resulting in higher production costs.

In contrast, recently, a method for coating a liquid silicon hydride in which a vacuum system is not used has been developed. Japanese Unexamined Patent Application Publication No. 1-29661 discloses a method for forming a silicon-based thin film, in which a gaseous raw material is liquefied and adsorbed on a cooled substrate, followed by reaction with atomic hydrogen which is chemically active. However, a complex apparatus is required in order to continuously vaporize and cool the raw material silicon hydride, and it is also difficult to control the thickness of the film.

Japanese Unexamined Patent Application Publication No. 7-267621 discloses a method for coating a liquid silicon hydride having a low molecular weight onto a substrate. However, in this method, handling is difficult due to the instability in the system, and because the material is liquid, it is difficult to obtain a film of uniform thickness when used for a substrate with a large surface area.

On the other hand, although United Kingdom Patent No. GB-2077710A discloses an example of a solid silicon hydride polymer, since the polymer is insoluble in solvents, it is not possible to form a film by coating.

Furthermore, Japanese Unexamined Patent Application Publication No. 9-237927 discloses a method in which a silicon film is separated by pyrolysis after a polysilane solution is applied onto a substrate for the purpose of fabricating solar cells. However, when a silicon compound containing carbon is subjected to pyrolysis or photolysis by ultraviolet light, since a large amount of carbon remains as impurities, it is difficult to obtain an amorphous or polycrystalline silicon film having superior electrical characteristics.

The silicon semiconductor film described above is usually used as a p-type or n-type semiconductor by doping Group III or Group V elements of the periodic table. Such doping is usually performed by thermal diffusion or ion implantation after a silicon film is formed. Since the doping is performed in a vacuum, process control is troublesome, and in particular, it is difficult to form a uniformly doped silicon film over a large substrate.

In contrast, Japanese Unexamined Patent Application Publication No. 9-237927 described above discloses a method for coating by adding an alkyl compound for imparting p-type or n-type conductivity to a polysilane solution or a method for pyrolyzing a film coated with a polysilane solution in an atmosphere containing a dopant source. However, in the former case, a film which is uniformly doped is not obtained due a difference in solubility between the polysilane and the alkyl compound containing the dopant, and a large amount of carbon remains as impurities in the final film because carbon is contained therein as described above. In the latter case, it is difficult to control the amount of doping.

It is an object of the present invention to provide a completely novel method for forming a desired silicon film in which vapor phase deposition, such as CVD, is performed onto a substrate which is heated and retained at a predetermined temperature, and after a solution containing a predetermined silicon compound is applied onto the substrate, the solvent is removed by heating or the like so as to form a coating film of the silicon compound, followed by decomposition in the film or further followed by laser irradiation to form a silicon film having characteristics of an electrical material on the substrate. In particular, it is also an object of the present invention to provide a method for forming a silicon film doped with boron or phosphorus over a large substrate in relation to the fabrication of a device in which, after a film composed of a modified silicon compound is formed by coating as a precursor of the silicon film, the silicon precursor film is transformed into semiconductor silicon by heat and/or light treatment in an inert atmosphere, and simultaneously, doping can be performed.

In accordance with the present invention, a first method for forming a silicon film includes the step of applying a solution containing a cyclic silicon compound represented by the formula $Si_nX_m$ (where n is an integer of 5 or more, m is an integer of n, 2n−2, or 2n, and X is a hydrogen atom and/or halogen atom), onto a substrate.

In such a method, preferably, the method includes the steps of removing the solvent after the solution is applied, and performing pyrolysis and/or photolysis of the coating film, or further performing laser irradiation, and thus, the silicon film can be finally obtained.

In accordance with the present invention, a second method for forming a silicon film includes the step of applying a solution containing a modified silicon compound, which is represented by the formula $Si_aX_bY_c$ (where X is a hydrogen atom and/or halogen atom, Y is a boron atom or phosphorus atom, a is an integer of 3 or more, b is an integer from a to 2a+c+2, and c is an integer from 1 to a), or a mixture of a silicon compound and the modified silicon compound, onto a substrate.

In such a method, preferably, the method includes the steps of removing the solvent after the solution is applied, and performing pyrolysis and/or photolysis of the coating film, or further performing laser irradiation, and thus, the silicon film modified by boron or phosphorus can be finally obtained.

By the methods described above, silicon films having superior characteristics as electronic materials can be obtained.

DETAILED DESCRIPTION OF THE EMBODIMENTS

The present invention will be described in detail below.

The silicon compound used in the first method for forming the silicon film in the present invention is a cyclic silicon compound, which is represented by the formula $Si_nX_m$ (where n is an integer of 5 or more, m is an integer of n, 2n−2, or 2n, and X is a hydrogen atom and/or halogen atom).

In particular, in the silicon compound represented by the formula $Si_nX_m$, preferably, n is 5 to 20, and more preferably, n is 5 or 6. If n is less than 5, since the silicon compound itself will be unstable due to strain resulting from the ring, handling is difficult. If n exceeds 20, solubility in the solution is decreased due to cohesion of the silicon compounds, and choice of practically usable solvents is limited.

Specific examples of the silicon compound represented by the above formulae, having a single ring, include cyclopentasilane, silylcyclopentasilane, cyclohexasilane, silylcyclohexasilane, and cycloheptasilane, and specific bicyclic examples include 1,1'-biscyclobutasilane, 1,1'-biscyclopentasilane, 1,1'-biscyclohexasilane, 1,1'-biscycloheptasilane, 1,1'-cyclobutasilylcyclopentasilane, 1,1'-cyclobutasilylcyclohexasilane, 1,1'-cyclobutasilylcycloheptasilane, 1,1'-cyclopentasilylcyclohexasilane, 1,1'-cyclopentasilylcycloheptasilane, 1,1'-cyclohexasilylcycloheptasilane, spiro[2,2]pentasilane, spiro[3,3]pentasilane, spiro[4,4]nonasilane, spiro[4,5]decasilane, spiro[4,6]undecasilane, spiro[5,5]undecasilane, spiro[5,6]dodecasilane, and spiro[6,6]tridecasilane.

As examples of polycyclic compounds, compounds 1 to 5 represented by the formulae below may be mentioned.

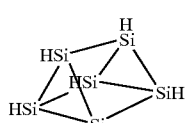

Compound 1

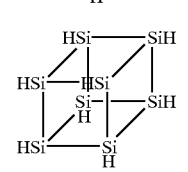

Compound 2

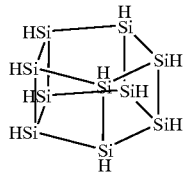

Compound 3

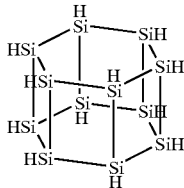

Compound 4

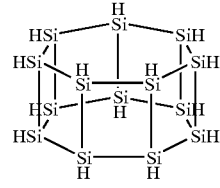

Compound 5

In addition to the silicon hydride compounds described above, silicon hydrides in which hydrogen atoms in the structures thereof are partially replaced by $SiH_3$ groups or halogen atoms may be mentioned. It is also possible to use a mixture of two or more types thereof. Among these, in view of solubility in the solvents, 1,1'-biscyclopentasilane, 1,1'-biscyclohexasilane, spiro[4,4]nonasilane, spiro[4,5] decasilane, spiro[5,5]undecasilane, spiro[5,6]dodecasilane, and silicon compounds having $SiH_3$ groups in the structures thereof are particularly preferable.

In the first method of the present invention, a solution is used containing a cyclic silicon compound, which is represented by the formula $Si_nX_m$, as an essential constituent, and the solution may contain a silicon compound, such as n-pentasilane, n-hexasilane, or n-heptasilane.

A solution used in the second method for forming the silicon film of the present invention contains, as an essential constituent, the modified silane compound represented by the formula $Si_aX_bY_c$ (where X is a hydrogen atom and/or halogen atom, Y is a boron atom or phosphorus atom, a is an integer of 3 or more, b is an integer from a to 2a+c+2, and c is an integer from 1 to a). X in the formula is a halogen atom, such as a fluorine atom, chlorine atom, bromine atom, or iodine atom, and Y in the formula is a boron atom or a phosphorus atom. The modified silane compound is transformed into silicon modified with boron atoms or phosphorus atoms when the modified silane compound is subjected to pyrolysis and/or photolysis in an inert gas atmosphere or in a reducing gas atmosphere, or is further subjected to laser irradiation. Also, a, b, and c in the formula satisfy the following relationships. That is, a is an integer of 3 or more, b is an integer from a to 2a+c+2, and c is an integer from 1 to a. If a is less than 3, it is difficult to form a satisfactory modified silane film by a coating method because the modified silane compound is gaseous or liquid.

In particular, as the silicon compound represented by the formula $Si_aX_bY_c$, preferably, a+c is 5 to 20, and more preferably, a+c is 5 or 6. If n is less than 5, since the silicon compound itself becomes unstable due to strain resulting from the ring, handling is difficult. If a+c exceeds 20, solubility in the solution is decreased due to cohesion of the silicon compounds, and choice of practically usable solvents is limited.

As examples of the compounds represented by the formula $Si_aX_bY_c$, compounds 6 to 27, represented by the formulae below as modified silane compounds may be mentioned.

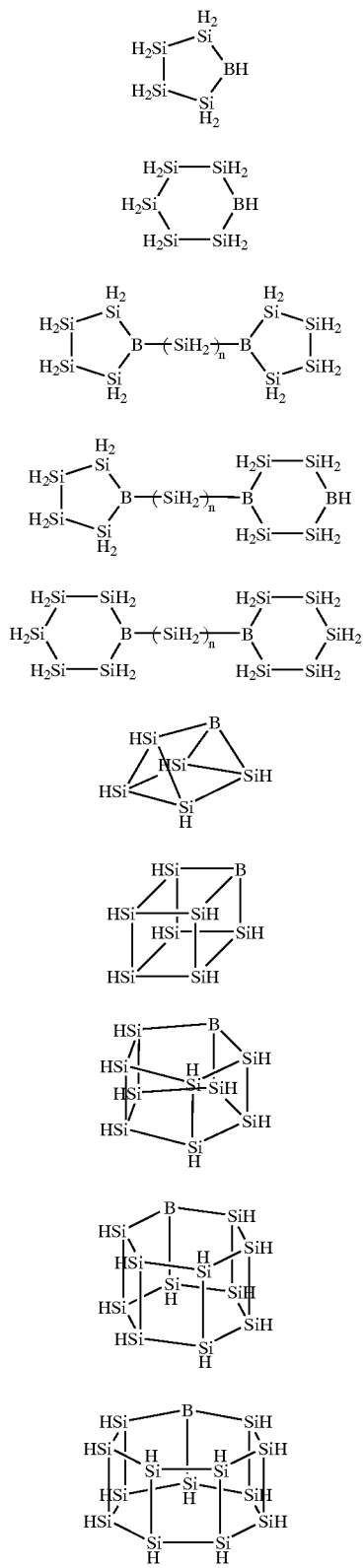

Compound 6
Compound 7
Compound 8
Compound 9
Compound 10
Compound 11
Compound 12
Compound 13
Compound 14
Compound 15

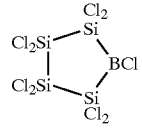

Compound 16

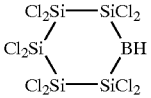

Compound 17

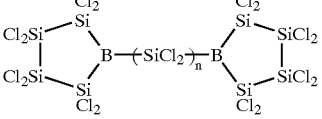

Compound 18

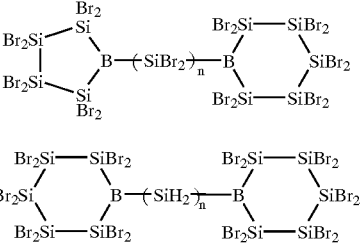

Compound 19

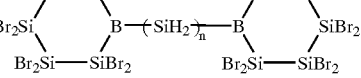

Compound 20

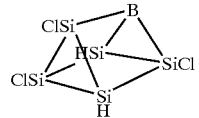

Compound 21

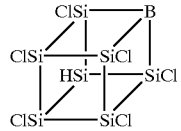

Compound 22

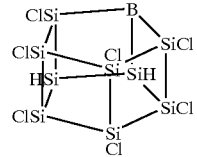

Compound 23

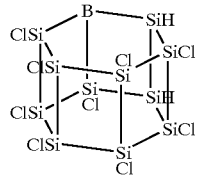

Compound 24

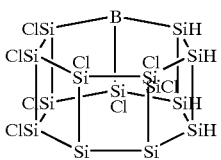

Compound 25

Compound 26

Compound 27

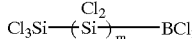

Herein, n in the compounds 8, 9, 10, 18, 19, and 20 is an integer of 0 or more, and m in the compounds 26 and 27 is an integer of 2 or more. Additionally, although in the formulae, only silane compounds modified with boron are mentioned, as silane compounds modified with phosphorus, modified silane compounds having the same structures as those of the silane compounds modified with boron may be mentioned.

In the present invention, the modified silane compound may be used alone as the silicon compound in the solution, or may be used by mixing with the silane compound which is not modified. Although the mixture ratio between the modified silane compound and the unmodified silane compound differs depending on the content of the modifier element, i.e., boron or phosphorus, in the modified silane compound, the modifier element may range from approximately 1 ppb to 25% relative to silicon atoms.

In the methods of the present invention, a solution in which the silicon compound represented by the formula $Si_nX_m$ and/or the modified silicon compound represented by the formula $Si_aX_bY_c$ are dissolved in a solvent is applied to a substrate. In the present invention, the solvent used for the solution usually has a vapor pressure of 0.001 to 200 mmHg at room temperature. If the vapor pressure is higher than 200 mmHg, when a coating film is formed by coating, the solvent may be vaporized first, resulting in difficulty in forming a satisfactory coating film. On the other hand, if the vapor pressure is lower than 0.001 mmHg, drying is slow and the solvent easily remains in the coating film of the silicon compound, and a satisfactory silicon and modified silicon film may not be obtained even after heat and/or light treatment in post-processing.

The solvent used in the present invention is not particularly limited as long as it dissolves the silicon compounds and it is not reactive with the silicon compounds. Specific examples include hydrocarbon solvents, such as n-hexane, n-heptane, n-octane, n-decane, dicyclopentane, benzene, toluene, xylene, durene, indene, tetrahydronaphthalene, decahydronaphthalene, and squarane; ether-based solvents, such as dipropyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, tetrahydrofuran, tetrahydropyran, 1,2-dimethoxyethane, bis (2-methoxyethyl)ether, and p-dioxane; and polar solvents, such as propylene carbonate, γ-butyrolactone, N-methyl-2-pyrrolidone, dimethylformamide, acetonitrile, dimethyl sulfoxide, and chloroform. Among these, in view of the solubility of the silicon compounds and modified silicon compounds and the stability of the solution, hydrocarbon solvents and ether-based solvents are preferably used, and as more preferable solvents, hydrocarbon solvents may be mentioned. The solvents described above may be used alone or in a mixture of two or more types. In particular, hydrocarbon solvents are suitable because they improve the solubility of the silicon compounds and inhibit the silicon compounds from remaining after the heat treatment or light treatment described below.

In the present invention, in the formation of the silicon film, a gas is not supplied, such as would be the case in CVD, which is conventionally performed, and after the solution in which the silicon compound described above is dissolved is applied to a substrate, the solvent is dried, forming a film from the silicon compound, and the film of the silicon compounds is transformed into a metallic silicon film by pyrolysis and/or photolysis. Alternatively, after the pyrolysis and/or photolysis, the film is further transformed into a polycrystalline silicon film by laser treatment. In particular, when a modified silicon compound is used, it is possible to form a p-type or n-type silicon film without subjecting the silicon film modified by boron atoms or phosphorus atoms to ion implantation in a vacuum system.

As the method for coating the solution containing the silicon compound, spin coating, roll coating, curtain coating, dip coating, spraying, ink jetting, or the like may be used. Coating is generally performed at a temperature that is equal to or higher than room temperature. At a temperature below room temperature, the solubility of the silicon compound may be decreased and the silicon compound may be partially precipitated. Coating is preferably performed in an atmosphere of an inert gas, such as nitrogen, helium, or argon. Furthermore, as required, a reducing gas, such as hydrogen, is preferably mixed therewith. When spin coating is used, the number of revolutions of a spinner, which depends on the thickness of the thin film to be formed and the composition of the coating solution, is generally set at 100 to 5,000 rpm, and preferably at 300 to 3,000 rpm. After coating is performed, heat treatment is carried out in order to remove the solvent. Although the heating temperature differs depending on the type of the solvent used and the boiling point (vapor pressure), it usually ranges from 100° C. to 200° C. Heating is preferably performed in the same atmosphere as that in the coating step, i.e., in an inert gas, such as nitrogen, helium, or argon.

In the present invention, the silicon compound is transformed into a silicon film by heat and/or light treatment. The silicon film obtained in the present invention is either amorphous or polycrystalline. In the case of heat treatment, in general, amorphous silicon films are obtained at an attained temperature of approximately 550° C. or less, and polycrystalline silicon films are obtained at a temperature higher than the above. In order to obtain an amorphous silicon film, heat treatment is performed preferably at 300° C. to 550° C., and more preferably, at 350° C. to 500° C. If the attained temperature is less than 300° C., pyrolysis of the silicon compound does not proceed sufficiently, and a silicon film having a sufficient thickness may not be formed. The heat treatment is preferably performed in an atmosphere of an inert gas, such as nitrogen, helium, or argon, or a reducing gas, such as hydrogen, may be mixed therewith. In order to obtain a polycrystalline silicon film, the amorphous silicon film obtained above can be transformed into a polycrystalline silicon film by laser irradiation. The laser irradiation is preferably performed in an atmosphere which does not contain oxygen, for example, in an atmosphere of an inert gas, such as nitrogen, helium, or argon, or in an atmosphere of the inert gas in which a reducing gas, such as hydrogen, is mixed.

On the other hand, the coating film of the silicon compound solution may be subjected to light treatment in an inert gas atmosphere before and/or after the solvent is removed. The silicon compound which is soluble in the solvent is transformed into a tough coating film which is insoluble in the solvent, and after light treatment is performed, or by simultaneously, performing heat treatment, the film is transformed into a silicon film having superior optical and electrical characteristics.

In the present invention, as a light source to be used in the light treatment for transforming the silicon compound into the silicon film, a low pressure or high pressure mercury lamp, a deuterium lamp, discharge light of a rare gas, such as argon, krypton, or xenon, a YAG laser, an argon laser, a carbon dioxide laser, an excimer laser using XeF, XeCl, XeBr, KrF, KrCl, ArF, ArCl, etc., or the like may be used.

Although the light source with an output of 10 to 5,000 W is generally used, the output of 100 to 1,000 W is usually sufficient. Although the wavelength of such a light source is not particularly limited as long as the silicon compound absorbs light anywise, the wavelength is usually in the range of 170 nm to 600 nm, and in particular, in view of absorption efficiency, the wavelength is preferably in the range of 170 nm to 380 nm. In view of transformation efficiency into polycrystalline silicon films, the use of laser beams is particularly preferable. The temperature during such light treatment is usually in the range from room temperature to 500° C., and it can be appropriately selected depending on semiconductor characteristics of the resulting silicon film.

The silicon compound solution in the present invention has a concentration of approximately 1 to 80% by weight, and the concentration can be adjusted according to the desired thickness of the silicon film. If the concentration exceeds 80%, precipitation easily occurs and a uniform coating film cannot be obtained.

A slight amount of a regulator of surface tension, which is, for example, fluorine-based, silicone-based, or nonionic, may be added to the solution as required in the range which does not impair the targeted function. The nonionic regulator of surface tension improves the wettability of the solution toward an object to be coated, improves leveling of the coated film, and prevents bubbles in the coating film or an orange peel surface from occurring.

As such a nonionic surfactant, a fluorine-containing surfactant having a fluorinated alkyl group or perfluoroalkyl group, or a polyether alkyl type surfactant having an oxy-alkyl group may be mentioned. Examples of the fluorine-containing surfactant include $C_9F_{19}CONHC_{12}H_{25}$, $C_8F_{17}SO_2NH$-$(C_2H_4O)_6H$, $C_9F_{17}O$ (PLURONIC L-35) $C_9F_{17}$, $C_9F_{17}O$ (PLURONIC P-84) $C_9F_{17}$, and $C_9F_7O$ (TETRONIC-704) $(C_9F_{17})_2$. (Herein, PLURONIC L-35: produced by Asahi Denka Kogyo K.K., polyoxypropylene-polyoxyethylene block copolymer, with an average molecular weight of 1,900; PLURONIC P-84: produced by Asahi Denka Kogyo K.K., polyoxypropylene-polyoxyethylene block copolymer, with an average molecular weight of 4,200; TETRONIC-704: produced by Asahi Denka Kogyo K.K., N,N,N',N'-tetrakis (polyoxypropylene-polyoxyethylene block copolymer), with an average molecular weight of 5,000).

Specific examples of the fluorine-containing surfactants include F TOP EF301, F TOP EF303, F TOP EF352 (produced by Shin Akita Kasei Co., Ltd.), MEGAFAC F171, MEGAFAC F173 (produced by Dainippon Ink and Chemicals, Inc.), ASAHI GUARD AG710 (produced by Asahi Glass Co., Ltd.), FLUORAD FC-170C, FLUORAD FC430, FLUORAD FC431 (produced by Sumitomo 3M Limited), SURFLON S-382, SURFLON SC101, SURFLON SC102, SURFLON SC103, SURFLON SC104, SURFLON SC105, SURFLON SC106 (produced by Asahi Glass Co., Ltd.), BM-1000, BM-1100 (produced by B. M-Chemie), and Schsego-Fluor (produced by Schwegmann).

Examples of the polyether alkyl type surfactant include polyoxyethylene alkyl ethers, polyoxyethylene allyl ethers, polyoxyethylene alkylphenol ethers, polyoxyethylene fatty acid esters, sorbitan fatty acid esters, polyoxyethylene sorbitan fatty acid esters, and oxyethylene-oxypropylene block copolymers.

Specific examples of the polyether alkyl type surfactants include EMULGEN 105, EMULGEN 430, EMULGEN 810, EMULGEN 920, RHEODOL SP-40S, RHEODOL TW-L120, EMANOL 3199, EMANOL 4110, EXCEL P-40S, BRIDGE 30, BRIDGE 52, BRIDGE 72, Bridge 92, ARLACEL 20, EMASOL 320, TWEEN 20, TWEEN 60, MYRJ 45 (all of the above are produced by Kao Corp.), and NONIPOL 55 (produced by Sanyo chemical Industries, Ltd.). As nonionic surfactants other than those described above, for example, polyoxyethylene fatty acid esters, polyoxyethylene sorbitan fatty acid esters, and polyalkylene oxide block copolymers may be mentioned. Specific examples include CHEMISTAT 2500 (produced by Sanyo Chemical Industries, Ltd.), SN-EX9228 (produced by San Nopco Ltd.), and NONAL 530 (produced by Toho Chemical Industry Co., Ltd.). The amount of use of the nonionic surfactant is preferably set at 0.01 to 10 parts by weight, and more preferably at 0.1 to 5 parts by weight relative to 100 parts by weight of constituents (a)+(b). If the amount is less than 0.01 part by weight, the effect of the nonionic surfactant is not displayed. If the amount exceeds 10 parts by weight, foaming of the resulting composition is easily caused and thermal discoloring may occur, which is not preferable.

The viscosity of the silicon compound solution thus prepared usually ranges from 1 to 100 mPa·s, and it can be appropriately selected depending on the coating apparatus and the targeted thickness of the coating film. If the viscosity exceeds 100 mpa·s, it becomes difficult to obtain a uniform coating film.

The substrate used is not particularly limited, and in addition to quartz, borosilicate glass, soda glass substrates which are usually used, transparent electrodes composed of ITO or the like, metallic substrates composed of gold, silver, copper, nickel, titanium, aluminum, tungsten, etc., glass and plastic substrates provided with these metals on surfaces, etc., may be used.

The present invention will be described in more detail based on the examples below. However, it is to be understood that the present invention is not limited to the examples.

EXAMPLE 1

A coating solution was prepared by dissolving 2 g of 1,1'-bis(cyclohexasilane) in 10 g of toluene. The solution had a viscosity of 8 mpa·s. The solution was spin-coated onto a quartz substrate in an argon atmosphere, followed by drying at 150° C., and then pyrolysis was performed at 450° C. in argon. A metallic silicon film with a thickness of 65 nm was obtained. The composition of the surface of the silicon film was analyzed by ESCA, and silicon atoms only were detected. Furthermore, the crystalline state of the silicon film was observed based on the Raman spectrum of the silicon film, and the 100% amorphous state was confirmed. When the amorphous silicon film was further heated to 800° C. in argon containing 3% hydrogen, a sharp peak was observed at 520 $cm^{-1}$, and as a result of analysis, a polycrystalline silicon film having a crystallinity of 50% was identified.

EXAMPLE 2

A metallic silicon film with a thickness of 65 nm was obtained in a manner similar to that in Example 1, apart from the fact that toluene used as the solvent in Example 1 was replaced with 10 g of tetrahydronaphthalene. The composition of the surface of the silicon film was analyzed by ESCA, and silicon atoms only were detected. Furthermore, the crystalline state of the silicon film was observed based on the Raman spectrum of the silicon film, and the 100% amorphous state was confirmed. Furthermore, when the amorphous silicon film was irradiated by an excimer laser having a wavelength of 308 nm with an energy density of 320 mJ/cm$^2$ in an argon atmosphere and the Raman spectrum was observed again, polycrystalline silicon having a crystallinity of 70% was identified.

EXAMPLE 3

A coating solution was prepared by dissolving 3 g of 1,1'-bis(cyclopentasilane) in a mixed solvent including 3 g of toluene, 3 g of xylene, and 3 g of tetrahydronaphthalene. The solution had a viscosity of 15 mpa·s. The solution was spin-coated onto a quartz substrate in an argon atmosphere, followed by drying at 200° C., and then ultraviolet light was applied for 30 minutes by a high pressure mercury lamp of 500 W while heating at 300° C. in an argon atmosphere containing 3% hydrogen. A metallic silicon film with a thickness of 90 nm was obtained. The composition of the surface of the silicon film was analyzed by ESCA, and silicon atoms only were detected. Furthermore, the crystalline state of the silicon film was observed based on the Raman spectrum of the silicon film, and the 100% amorphous state was confirmed. Furthermore, when the amorphous silicon film was irradiated by an excimer laser having a wavelength of 308 nm with an energy density of 400 mJ/cm$^2$ in an argon atmosphere and the Raman spectrum was observed again, polycrystalline silicon having a crystallinity of 70% was identified.

EXAMPLE 4

A coating solution was prepared by dissolving 2 g of silylcyclopentasilane in 10 g of toluene. The solution had a viscosity of 7 mpa·s. The solution was spin-coated onto a quartz substrate in an argon atmosphere, followed by drying at 150° C., and then pyrolysis was performed at 450° C. in argon containing 3% hydrogen. A metallic silicon film with a thickness of 65 nm was obtained. The composition of the surface of the silicon film was analyzed by ESCA, and silicon atoms only were detected. Furthermore, the crystalline state of the silicon film was observed based on the Raman spectrum of the silicon film, and the 100% amorphous state was confirmed. Furthermore, when the amorphous silicon film was irradiated by an excimer laser having a wavelength of 308 nm with an energy density of 320 mJ/cm$^2$ in an argon atmosphere and the Raman spectrum was observed again, polycrystalline silicon having a crystallinity of 80% was identified.

EXAMPLE 5

A coating solution was prepared by dissolving 3 g of 1-borahexasilaprismane (compound 11 described above) as a boron-modified silicon compound, in 10 g of toluene. The solution had a viscosity of 6 mpa·s. The solution was spin-coated onto a quartz substrate in an argon atmosphere, followed by drying at 150° C., and then pyrolysis was performed at 500° C. in argon containing 3% hydrogen. A metallic silicon film with a thickness of 65 nm was obtained. When the composition of the surface of the silicon film was analyzed by ESCA, silicon atoms and boron atoms only were detected, and the ratio thereof was 5:1. Furthermore, the crystalline state of the silicon film was observed based on the Raman spectrum of the silicon film, and the 100% amorphous state was confirmed. The amorphous modified silicon film was further heated to 800° C. in argon containing 3% hydrogen, a sharp peak was observed at 520 cm$^{-1}$, and as a result of analysis, a polycrystalline silicon film having a crystallinity of 50% was identified.

EXAMPLE 6

A coating solution was prepared by dissolving 1 g of 1-boracyclohexasilane (compound 7 described above) as a boron-modified silicon compound, and 10 g of cyclohexasilane in 30 g of tetrahydronaphthalene. The solution had a viscosity of 8.5 mpa·s. The solution was dip-coated, in an argon atmosphere, onto a quartz substrate to which gold had been vapor-deposited, and drying was performed at 200° C. A satisfactory film was formed. By subjecting the substrate to heat treatment in a manner similar to that in Example 4, transformation into a silicon film was enabled. When the composition of the surface of the silicon film was analyzed by ESCA, silicon atoms and boron atoms only were detected, and the ratio thereof was 60:1. The crystalline state of the silicon film was observed based on the Raman spectrum of the silicon film, and the 100% amorphous state was confirmed. The amorphous modified silicon film was irradiated by an excimer laser having a wavelength of 308 nm with an energy density of 350 mJ/cm$^2$ in an argon atmosphere and the Raman spectrum was observed again. Polycrystalline silicon having a crystallinity of 80% was identified.

EXAMPLE 7

A coating solution was prepared by dissolving 1 g of 1-phosphohexasilaprismane as a phosphorus-modified silicon compound and 10 g of cyclopentasilane in 25 g of toluene. The solution had a viscosity of 8.5 mpa·s. The solution was spin-coated in an argon atmosphere onto a quartz substrate to which gold had been vapor-deposited, and drying was performed at 150° C. A satisfactory film was formed. By subjecting the substrate to heat treatment in a manner similar to that in Example 4, transformation into a silicon film was enabled. When the composition of the surface of the silicon film was analyzed by ESCA, silicon atoms and phosphorus atoms only were detected and the ratio thereof was 50:1. Furthermore, the crystalline state of the silicon film was observed based on the Raman spectrum of the silicon film, and the 100% amorphous state was confirmed. Furthermore, when the amorphous modified silicon film was irradiated by an excimer laser having a wavelength of 308 nm with an energy density of 350 mJ/cm$^2$ in an argon atmosphere and the Raman spectrum was observed again, polycrystalline silicon having a crystallinity of 75% was identified.

EXAMPLE 8

A coating solution was prepared by dissolving 1 g of 1-phosphocyclopentasilane as a phosphorus-modified silicon compound in a mixed solvent including 3 g of toluene, 3 g of xylene, and 3 g of tetrahydronaphthalene. The solution had a viscosity of 11 mPa·s. The solution was spin-coated onto a quartz substrate in an argon atmosphere, followed by drying at 200° C., and then ultraviolet light was applied for 30 minutes by a high pressure mercury lamp of 500 W while heating at 300° C. in an argon atmosphere containing 3% hydrogen. A metallic silicon film with a thickness of 35 nm was obtained. When the composition of the surface of the silicon film was analyzed by ESCA, silicon atoms and boron atoms only were detected, and no other atoms were observed. Furthermore, the crystalline state of the silicon film was observed based on the Raman spectrum of the silicon film, and the 100% amorphous state was confirmed. Furthermore, when the amorphous modified silicon film was irradiated by an excimer laser having a wavelength of 308 nm with an energy density of 300 mJ/cm$^2$ in an argon atmosphere and the Raman spectrum was observed again, polycrystalline silicon having a crystallinity of 75% was identified.

EXAMPLE 9

A coating solution was prepared by dissolving 2 g of hexasilaprismane (compound 1) in 10 g of toluene. The solution had a viscosity of 10 mpa·s. The solution was spin-coated onto a quartz substrate in an argon atmosphere containing 3% hydrogen, and ultraviolet light was applied for 5 minutes by a high pressure mercury lamp of 500 W while the substrate was maintained at room temperature. As a result, a film of polyhydrosilane was produced. The film was heated at 500° C. in argon containing 3% hydrogen, followed by pyrolysis. A metallic silicon film with a thickness of 60 nm was obtained. When the composition of the surface of the silicon film was analyzed by ESCA, silicon atoms only were detected, and no other atoms were observed. Furthermore, the crystalline state of the silicon film was observed based on the Raman spectrum of the silicon film, and the 100% amorphous state was confirmed. Furthermore, when the amorphous silicon film was irradiated by an excimer laser having a wavelength of 308 nm with an energy density of 300 mJ/cm$^2$ in an argon atmosphere and the Raman spectrum was observed again, polycrystalline silicon having a crystallinity of 85% was identified.

EXAMPLE 10

An amorphous silicon film was formed in the same process as that in Example 9. The silicon film was then irradiated by an excimer laser in air under the same conditions as those in Example 9, and the Raman spectrum was observed. Polycrystalline silicon having a crystallinity of 60% was identified.

As described above in detail, in accordance with the present invention, a silicon film is formed by a novel coating process which differs from the conventional method for forming a silicon film. Instead of vapor deposition such as in the conventional CVD methods, or ion implantation in a vacuum, after a liquid-phase material is applied, transformation of the material into a silicon film and a doped silicon film, which are used as electronic materials, is performed by heat and/or light energy, which is thus a superior method.

INDUSTRIAL APPLICABILITY

In accordance with the present invention, generation of powder can be avoided in the formation of silicon films and a large vacuum process is not used, which is different from the conventional CVD methods. Therefore, an expensive apparatus is not required, and it is also possible to form films over a large substrate, and thus, it is possible to fabricate semiconductor devices, such as LSIs having silicon films and doped p-type and n-type silicon films, thin-film transistors, photoelectric conversion devices, and photosensitive members, by the energy-saving process.

What is claimed is:

1. A method for forming a silicon film, comprising:
   a step of applying a solution containing a cyclic silicon compound including a cyclic structure represented by formula $Si_nX_m$ onto a substrate, where n is an integer of 5 and m is an integer of 8, 10, or n is an integer of 6 and m is an integer of 6, 10, 12, and X is a hydrogen atom, the silicon compound being not solid at room temperature.

2. The method for forming a silicon film according to claim 1, wherein n is 5 to 20.

3. The method for forming a silicon film according to claim 1, wherein a solute concentration is 1 to 80% by weight in the solution containing the silicon compound.

4. The method for forming a silicon film according to claim 1, wherein viscosity is 1 to 100 mPa·s in the solution containing the silicon compound.

5. The method for forming a silicon film according to claim 1, wherein the silicon compound is dissolved in at least one solvent having a vapor pressure of 0.001 to 200 mmHg at room temperature.

6. The method for forming a silicon film according to claim 1, further comprising:
   a drying step for removing the solvent after the solution containing the silicon compound is applied; and
   a step for performing pyrolysis and/or photolysis of the coating film.

7. The method for forming a silicon film according to claim 5, wherein the solvent comprises a hydrocarbon solvent.

8. The method for forming a silicon film according to claim 6, wherein the photolysis is performed by light having a wavelength of 170 nm to 380 nm.

9. The method for forming a silicon film according to claim 6, further comprising a step of transforming amorphous silicon into polycrystalline silicon by laser irradiation.

10. The method for forming a silicon film according to claim 9, wherein the laser irradiation is performed in an oxygen-free atmosphere.

11. A method for forming a silicon film, comprising:
    a step of applying a solution containing a cyclic silicon compound including a cyclic structure represented by formula $Si_nX_m$, where n is an integer of 5 and m is an integer of 8, 10, or n is an integer of 6 and m is an integer of 6, 10, 12, and X is a hydrogen atom, and a silicon compound represented by formula $Si_aX_bY_c$, where X is a hydrogen atom and/or halogen atom, Y is a boron atom or phosphorous atom, a is an integer of 3 or more, b is an integer from a to 2a+c+2, and c is an integer of 3 or more, b is an integer from 1 to a, onto a substrate, the silicon compound being not solid at room temperature.

12. The method for forming a silicon film according to claim 11, wherein n is 5 to 20.

13. The method for forming a silicon film according to claim 11, wherein a+c is 5 to 20.

14. The method for forming a silicon film according to claim 11, wherein a solute concentration is 1 to 80% by weight in the solution containing the silicon compound.

15. The method for forming a silicon film according to claim 11, wherein viscosity is 1 to 100 mPa·s in the solution containing the silicon compound.

16. The method for forming a silicon film according to claim 11, wherein the silicon compound is dissolved in at least one solvent having a vapor pressure of 0.001 to 200 mmHg at room temperature.

17. The method for forming a silicon film according to claim 11, further comprising:
    a drying step for removing the solvent after the solution containing the silicon compound is applied; and
    a step for performing pyrolysis and/or photolysis of the coating film.

18. The method for forming a silicon film according to claim 16, wherein the solvent comprises a hydrocarbon solvent.

19. The method for forming a silicon film according to claim 17, wherein the photolysis is performed by light having a wavelength of 170 nm to 380 nm.

20. The method for forming a silicon film according to claim 19, further comprising a step of transforming amorphous silicon into polycrystalline silicon by laser irradiation.

21. The method for forming a silicon film according to claim 20, wherein the laser irradiation is performed in an oxygen-free atmosphere.

* * * * *